United States Patent [19]

Matsuoka

[11] Patent Number: 4,924,289
[45] Date of Patent: May 8, 1990

[54] AIR BRIDGE WIRING FOR SEMICONDUCTOR DEVICES

[75] Inventor: Hiroshi Matsuoka, Itami, Japan

[73] Assignee: Mitsubishi Denki Kabushiki Kaisha, Japan

[21] Appl. No.: 208,083

[22] Filed: Jun. 17, 1988

[30] Foreign Application Priority Data

Jun. 19, 1987 [JP] Japan .................. 62-154104

[51] Int. Cl.$^5$ ........................... H01L 23/48
[52] U.S. Cl. .......................... 357/68; 357/65; 357/71; 357/45
[58] Field of Search ............. 357/68, 45, 71, 54, 357/67, 69, 65; 437/192

[56] References Cited

U.S. PATENT DOCUMENTS

| | | | |
|---|---|---|---|
| 3,921,194 | 11/1975 | Engeler et al. ............... | 357/24 |
| 3,932,226 | 1/1976 | Klatskin et al. .............. | 204/16 |
| 4,080,722 | 3/1978 | Klatskin et al. .............. | 29/580 |
| 4,308,090 | 12/1981 | Te Velde et al. ............. | 156/652 |
| 4,651,183 | 3/1987 | Lange et al. ................. | 357/23.6 |
| 4,673,966 | 6/1987 | Shimoyama ................. | 357/68 |

FOREIGN PATENT DOCUMENTS 2852049 6/1979 Fed. Rep. of Germany.
2361745 8/1977 France.

OTHER PUBLICATIONS

Geffken, "Multi-Level Metallurgy for Master Image Structured Logic", Dec., 1983, pp. 542–545.
"A GaAs MSI 8-bit Multiplexer and Demultiplexer", McCormack et al., GaAs IC Symposium, IEEE, 1982, pp. 25–28.

*Primary Examiner*—Martin H. Edlow
*Assistant Examiner*—Donald L. Monin
*Attorney, Agent, or Firm*—Leydig, Voit & Mayer

[57] ABSTRACT

A semiconductor device having an air bridge wiring structure comprising a first layer of conductors disposed on a semiconductor substrate, a plurality of bridges posts disposed on widened portions of the first layer of conductors, and bridge plates disposed straddling a plurality of bridge posts, the widened portions of the first layer of conductors being disposed at positions which are not in straight lines but are shifted with respect to each other.

9 Claims, 3 Drawing Sheets

F I G.2(b).
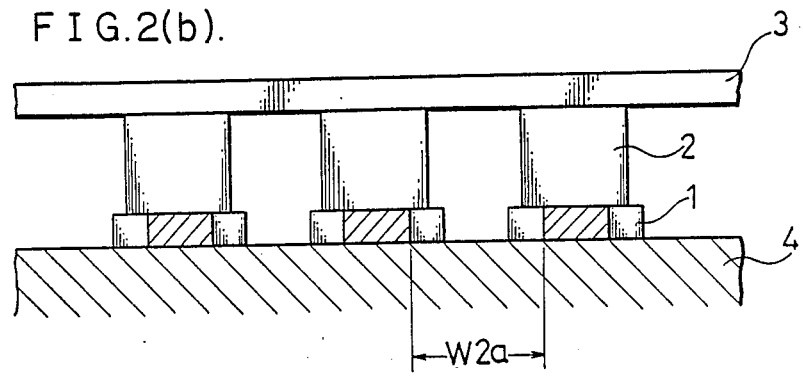

FIG. 3.

| process | first layer wiring | bridge post portion | bridge plate portion | characteristics |
|---|---|---|---|---|
| lift-off method | ◎ | ○ | ◎ | o difficult to obtain the height |
| gilding method | △ | ◎ | ○ | o effective in gaining the height |
| dry etching method | ○ | △ | ◎ | o damages are apt to enter into the substrate<br>o size controllability is good |
| wet etching method | △ | △ | △ | o size controllability is not good |

AIR BRIDGE WIRING FOR SEMICONDUCTOR DEVICES

FIELD OF THE INVENTION

The present invention relates to a semiconductor device and, more particularly, to a structure of air bridge wiring produced on a semiconductor substrate.

BACKGROUND OF THE INVENTION

FIG. 2 shows a prior art semiconductor device having an air bridge wiring structure. In FIG. 2, the reference numeral 1 designates a first wiring layer provided on a semiconductor substrate 4 and having a plurality of conductors. Bridge posts 2 are disposed on the widened portions 1a of the conductors of the first wiring layer 1. Bridge plate 3 is provided straddling a plurality of bridge post portions 2. The reference character W1 designates the marginal wiring interval between adjacent portions 1a of the conductors of wiring layer 1 which is required in view of process and design considerations. The reference character W2a designates the wiring interval between adjacent conductors in the first wiring layer.

In order to produce an air bridge wiring structure on a semiconductor substrate 4, the conductors of first wiring layer 1 are produced by a lift-off method or an etching method. Thereafter, bridge posts 2 are produced on the portions 1a of the conductors of wiring layer 1 by a gilding method or a lift-off method. Finally, bridge plate 3 is produced straddling a plurality of bridge posts 2 by a lift-off method or a gilding method, thereby producing an air bridge wiring structure.

The prior art semiconductor device having air bridge wirings has been designed such that bridge posts 2 of the air bridge structure are arranged in straight lines. The portion 1a of each of the first wiring layer conductors on which a bridge post 2 is to be produced needs to have a broader width relative to the width of the main conductors to allow for pattern shift and mask alignment margin during production of the bridge posts 2. Therefore, the interval W2a between main conductors is unavoidably lengthened. When the bridge posts 2 ae to be high, the resist for producing the bridge posts 2 must be thick. Therefore, the size of the bridge posts 2 is increased and interval W2a is further increased. Furthermore, when the number of main conductors is large, the tendency to increased interval width is accentuated, which is disadvantageous to reductions in chip size and cost.

SUMMARY OF THE INVENTION

An object of the present invention is to provide an air bridge wiring structure in a semiconductor device which does not increase the main conductor interval even when the size and height of the bridge posts of the air bridge wiring is large so that reductions in chip size and cost may be achieved even when the number of main conductors increases.

Other objects and advantages of the present invention will become apparent from the detailed description given hereinafter. It should be understood, however, that the detailed description and specific embodiments are given by way of illustration only since various changes and modifications within the spirit and scope of the invention will be apparent to those of skill in the art from this detailed description.

According to the present invention, widened portions of the first layer conductors on which bridge posts are disposed are not arranged in straight lines but are shifted, i.e., offset, from each other and from a straight line, as shown in FIG. 1(a). Accordingly, the wiring interval between main conductors is not increased and reduction in chip size and cost are realized.

BRIEF DESCRIPTION OF THE DRAWINGS

FIGS. 2(a) and 2(b) are a plan view and a side view showing a semiconductor device according to the prior art, respectively; and FIG. 3 is a diagram showing a table representing various methods for producing various portions of the air bridge wiring structure.

DETAILED DESCRIPTION OF THE PREFERRED EMBODIMENTS

Figure 1A:
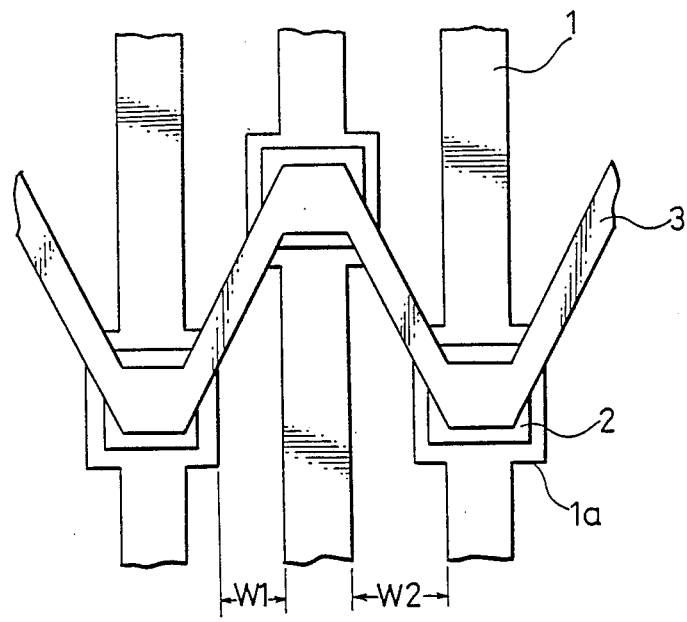
FIGS. 1(a) and 1(b) are a plan view and a side view showing a semiconductor device according to the present invention, respectively.
Figure 1B:
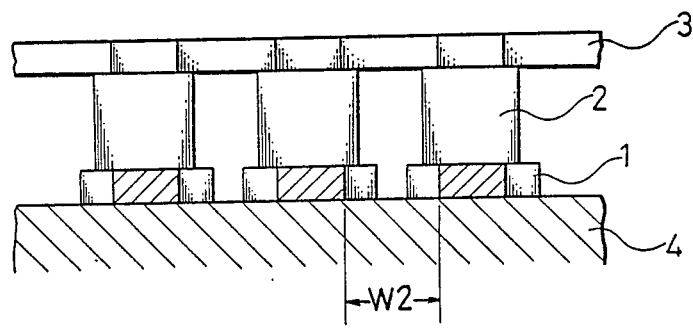
Figure 2A:
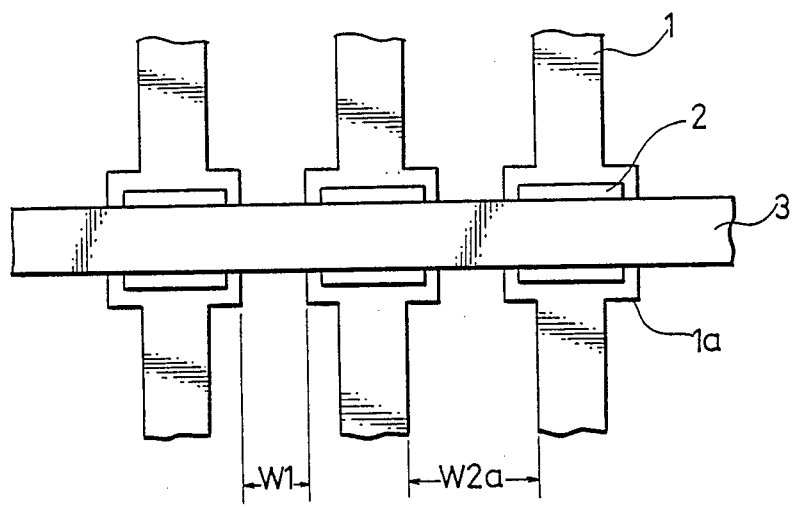

In FIG. 1, the reference numeral 1 designates one main conductor of a first wiring layer including a plurality of such conductors, all provided on a semiconductor substrate 4. Bridge posts 2 are disposed on widened portions 1a of the main conductors of the first wiring layer 1. Bridge plte 3 is provided on and straddles a plurality of bridge posts 2. The production method of the air bridge wiring structure of FIG. 1 is almost the same as that in the prior art device. In producing the first wiring layer 1, however, the bridge posts 2 of the air bridge wiring structure are arranged not in straight lines but in zigzag lines.

In the construction of FIG. 1, portion 1a of each of the main conductors of the first wiring layer on which a bridge post 2 is to be disposed is wide compared with the main conductor width. However, the size of the portion protruding in the direction transverse to the main conductors is reduced, even if the marginal wiring interval W1 is taken to be about the same value as in the prior art construction. Therefore, the wiring interval W2 of the first wiring layer 1 can be narrow compared to the prior art structure. For example, the wiring interval W2 of the first wiring layer 1 can be narrowed by the width of the wider portion that protrudes beyond the main conductor width as compared with the prior art device.

While in the above-illustrated embodiment the bridge posts 2 of the air bridge wiring structure are disposed along a zigzag line as an example of not being arranged in straight lines but shifted with respect to each other, the bridge posts may be disposed at positions in straight lines in diagonal directions, and the same effects as described above can be obtained.

Furthermore, the first wiring layer 1, the bridge posts 2, and the bridge plate 3 may be produced by any of a lift-off method, a gilding method, a dry etching method such as RIBE (reactive ion beam epitaxy), ion milling, wet etching using chemicals, or a combination thereof, and the same effects as described above can be obtained. Herein, a lift-off method is appropriate for production of the first wiring layer and the bridge plate, but it is inappropriate for production of bridge posts due to difficulty in obtaining sufficiently thick resist layers. A gilding method is appropriate for production of the bridge posts and bridge plate because it is effective in obtaining sufficient thickness. Furthermore, a dry etching method is appropriate for production of the bridge plate and the first wiring layer but it is not apt to damage the substrate while having a high size controllability. Besides, wet etching is also available, which is effective in the aspects of the process other than size controllability. The appropriateness of respective methods is briefly represented in the table of FIG. 3.

As is evident from the foregoing description, according to the present invention, wide portions of the first wiring layer for locating bridge posts are disposed at positions which are not arranged in straight lines but are shifted with respect to each other. Accordingly, the wiring interval between main conductors is not increased and reductions in chip size and cost are realized. In addition, the same production process as employed for the prior art devices can be employed.

What is claimed is:

1. In a semiconductor device, an air bridge wiring structure comprising a first layer of conductors disposed on a semiconductor substrate, at least some of said conductors having relatively narrow and relatively wide portions, a plurality of bridge posts disposed on said wide portions, and a substantially planar bridge plate disposed straddling said bridge posts, said wide portions of said first layer of conductors not being arranged in a straight line disposed transversely to said conductors.

2. The wiring structure according to claim 1 wherein said wide portions of said first layer of conductors are arranged in a zigzag line.

3. The wiring structure according to claim 1 wherein said wide portions of said first layer of conductors are arranged in lines that are diagonal to said conductors.

4. In a semiconductor device having a substrate on which a plurality of principal electrical conductors having relatively wide and relatively narrow portions are disposed generally parallel to each other and in spaced apart relationship, an air bridge wiring structure comprising the relatively wide portions of at least some of said principal electrical conductors, electrically insulating bridge posts disposed on at least some of said wide portions, and an electrically conducting, substantially planar bridge plate disposed on at least some of said bridge posts spaced apart and electrically isolated from said principal electrical conductors, wherein said posts on which said bridge plate is disposed lie in a path that is not a straight line transverse to said generally parallel principal electrical conductors.

5. The wiring structure according to claim 4 wherein said posts lie offset from a straight line transverse to said generally parallel principal electrical conductors on alternatingly opposite sides of said line.

6. The wiring structure according to claim 4 wherein said posts lie along a zigzag path disposed about a straight line generally transverse to said parallel principal electrical conductors.

7. The wiring structure according to claim 4 wherein said posts lie along a straight line path that is diagonal to said generally parallel principal electrical conductors.

8. In a semiconductor device having a substrate on which a plurality of principal electrical conductors having relatively wide and relatively narrow portions are disposed generally parallel to each other and in spaced apart relationship, an air bridge wiring structure comprising the relatively wide portions of at least some of said principal electrical conductors, electrically insulating bridge posts disposed on at least some of said wide portions, and an electrically conducting, substantially planar bridge plate disposed on at least some of said bridge posts spaced apart and electrically isolated from said principal electrical conductors, wherein said posts on which said bridge plate is disposed lie in a path that zigzags about a straight line transverse to said generally parallel principal electrical conductors.

9. In a semiconductor device having a substrate on which a plurality of principal electrical conductors having relatively wide and relatively narrow portions are disposed generally parallel to each other and in spaced apart relationship, an air bridge wiring structure comprising the relatively wide portions of at least some of said principal electrical conductors, electrically insulating bridge posts disposed on at least some of said wide portions, and an electrically conducting, substantially planar bridge plate disposed on at least some of said bridge posts spaced apart and electrically isolated from said principal electrical conductors, wherein said posts on which said bridge plate is disposed lie in a path that is a straight line that is diagonal to said generally parallel principal electrical conductors.

* * * * *